(12) United States Patent
Van De Graaff et al.

(10) Patent No.: US 6,496,421 B1
(45) Date of Patent: Dec. 17, 2002

(54) DISTRIBUTED CELL PLATE AND/OR DIGIT EQUILIBRATE VOLTAGE GENERATOR

(75) Inventors: Scott Van De Graaff, Boise, ID (US); Steve Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 91 days.

(21) Appl. No.: 09/653,539

(22) Filed: Aug. 31, 2000

(51) Int. Cl.[7] .............................................. G11C 16/04
(52) U.S. Cl. .................... 365/189.09; 365/149
(58) Field of Search ................ 365/189.09, 189.11, 365/189.06, 149, 201, 226

(56) References Cited

U.S. PATENT DOCUMENTS

| 5,042,011 A | | 8/1991 | Casper et al. | |
|---|---|---|---|---|
| 5,274,276 A | * | 12/1993 | Casper et al. | 326/121 |
| 5,280,205 A | | 1/1994 | Green et al. | |
| 5,500,824 A | * | 3/1996 | Fink | 365/149 |
| 5,627,785 A | | 5/1997 | Gilliam et al. | |
| 5,640,340 A | | 6/1997 | Fink | |
| 5,771,188 A | * | 6/1998 | Fink | 365/149 |
| 5,787,044 A | | 7/1998 | Duesman | |
| 5,841,691 A | * | 11/1998 | Fink | 365/149 |
| 5,946,257 A | | 8/1999 | Keeth | |

* cited by examiner

*Primary Examiner*—Richard Elms
*Assistant Examiner*—Hien Nguyen
(74) *Attorney, Agent, or Firm*—Dickstein Shapiro Morin & Oshinsky LLP

(57) ABSTRACT

A voltage reference circuit is provided in the periphery of a memory array. Each subarray of the memory array is associated with a respective voltage driver circuit responsible for generating the cell plate and equilibrate reference voltage for the memory cells in the subarray. The voltage reference circuit is connected to and controls each voltage driver so that each driver generates the proper reference voltage. The distributed circuitry substantially reduces the amount of space used within the memory array while mitigating the problems of prior art voltage generator circuits.

68 Claims, 5 Drawing Sheets

US 6,496,421 B1

DISTRIBUTED CELL PLATE AND/OR DIGIT EQUILIBRATE VOLTAGE GENERATOR

BACKGROUND OF THE INVENTION

1. Field of the Invention

The present invention relates to the field of semiconductor memory devices and, more particularly to semiconductor memory devices having a distributed cell plate and/or digit line equilibrate voltage generator.

2. Description of the Related Art

FIG. 1 illustrates a portion of a dynamic random access memory (DRAM) device 300. The DRAM 300 includes a plurality of dynamic memory cells 312, a plurality of word lines 314 and a plurality of bit lines 316. For convenience purposes, only two memory cells 312, word lines 314 and bit lines 316 are illustrated in FIG. 1.

The memory cells 312 are organized as an array of columns and rows. Each column typically includes numerous memory cell pairs, such as the single pair illustrated in FIG. 1. Although not illustrated, a typical column may contain 1024 or 2048 pairs of memory cells 312. Each memory cell 312 comprises a storage cell 320 (e.g., a capacitor) and an access device 322, which is typically a metal oxide semiconductor field effect transistor (MOSFET).

Two supply voltages are usually required to operate and access a DRAM cell 312. The first supply voltage is typically a ground and the second supply voltage is typically referred to as Vcc. A first side or cell plate of the storage cell 320 is connected to an intermediate cell plate reference voltage DVC2 having a potential between Vcc and ground. This cell plate reference voltage DVC2 is typically equal to Vcc/2, or the average of the first and second memory cell supply voltages. The cell plate reference voltage DVC2 is produced by a cell plate generator circuit (not shown). The first cell plates of all of the storage cells 320 are typically connected to the cell plate reference voltage DVC2.

A second side of each storage cell 320 is connected to one active terminal of an access device 322. One of the bit lines 316 is connected to the other active terminal of the access device 322. The gate or control terminal of the access device 322 is connected to one of the word lines 314. Thus, each memory cell 312 is connected to a word line 314 and a bit line 316. The word lines 314 and bit lines 316 form a two-dimensional array having a plurality of intersections. A single memory cell 312 corresponds to each intersection. At an intersection, a word line 314 is used to selectively activate the corresponding memory cell 312. Activating the memory cell 312 connects its storage cell 320 to the corresponding bit line 316, which allows conventional memory access operations (e.g., data read, data write and refresh) to occur.

The illustrated DRAM 300 also contains an equilibrate circuit 330. The equilibrate circuit 330 includes two MOSFET transistors 332, 334. One active terminal of each of each transistor 332, 334 is connected to receive the cell plate reference voltage DVC2. The other active terminal of each transistor 332, 334 is connected to one of the adjacent bit lines 316. The equilibrate circuit 330 is responsive to an equilibrate signal EQ to simultaneously connect the reference voltage DVC2 to the bit lines 316. During normal memory access operations, the equilibrate signal EQ is activated to "precharge" the bit lines 316 to the reference voltage DVC2 prior to activating the corresponding access transistor 322 and accessing the memory cells 312.

Typically, the first cell plate of each storage cell 320 is maintained at the non-varying cell plate reference voltage DVC2. The second cell plate is charged to either the first memory cell supply voltage or the second memory cell supply voltage, depending on whether a "0" or "1" is being written to the cell 320. Data is read from the cells 312 of the DRAM 300 by activating a word line 314 (via a row decoder), which couples all of the memory cells 312 corresponding to that word line 314 to respective bit lines 316, which define the columns of the array. One or more bit lines 316 are also activated. When a particular word line 314 is activated, sense amplifier circuitry connected to a bit line 316 detects and amplifies the data bit transferred from the storage cell 320 to its bit line 316 by measuring the potential difference between the activated bit line 316 and a reference line which may be an inactive bit line. The operation of typical DRAM sense amplifier circuitry is described, for example, in U.S. Pat. Nos. 5,627,785; 5,280,205; and 5,042,011, all assigned to Micron Technology Inc., and incorporated by reference herein.

While the DRAM 300 has proven to be a reliable architecture, it is not without its shortcomings. For example, the reference voltage DVC2 is generated by a centralized voltage generator circuit within the array of the DRAM 300. If the array is divided into subarrays, then the DRAM may contain multiple voltage generator circuits. Reference voltage DVC2 lines are then fanned out to the components of the array/subarrays. The voltage generator circuit is relatively large and consumes precious space within the array. There is a desire and need to reduce the amount of space used by the voltage generator circuitry in the array of the DRAM 300.

In addition, the reference voltage DVC2 generated by the voltage generator circuit may swell or experience dips in different portions of the DRAM 300. That is, different sections of the memory array will have different voltage levels. This adversely effects the operation of the standard DRAM functions such as reads, writes and precharging. Accordingly, there is a desire and need to reduce the amount of reference voltage swells and dips experienced in today's DRAM arrays.

Another problem experienced by the conventional DRAM 300 is bit line coupling. With the current DRAM configuration, the cell plates of the storage cells 320 move, which couples noise onto the bit lines 316. If there is too much movement, there will be too much noise on the bit lines 316. Bit line coupling creates memory cell margin problems, and are a direct result of the current centralized voltage generator techniques. Accordingly, there is a desire and need for a DRAM having a voltage generator circuit that reduces bit line coupling within its arrays.

SUMMARY OF THE INVENTION

The present invention provides voltage generator circuitry that substantially reduces the amount of reference voltage swells and dips in a DRAM memory array.

The present invention further provides voltage generator circuitry that substantially reduces bit line coupling within a DRAM memory array.

The above and other features and advantages of the invention are achieved by providing a voltage reference circuit in the periphery of a memory array. Each subarray of the memory array is associated with a respective voltage driver circuit responsible for generating the cell plate and equilibrate reference voltage for the memory cells in the subarray. The voltage reference circuit is connected to and controls each voltage driver so that each driver generates the proper reference voltage. The distributed circuitry substantially reduces the amount of space used within the memory array while mitigating the problems of prior art voltage generator circuits.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF PREFERRED EMBODIMENTS

Figure 2:
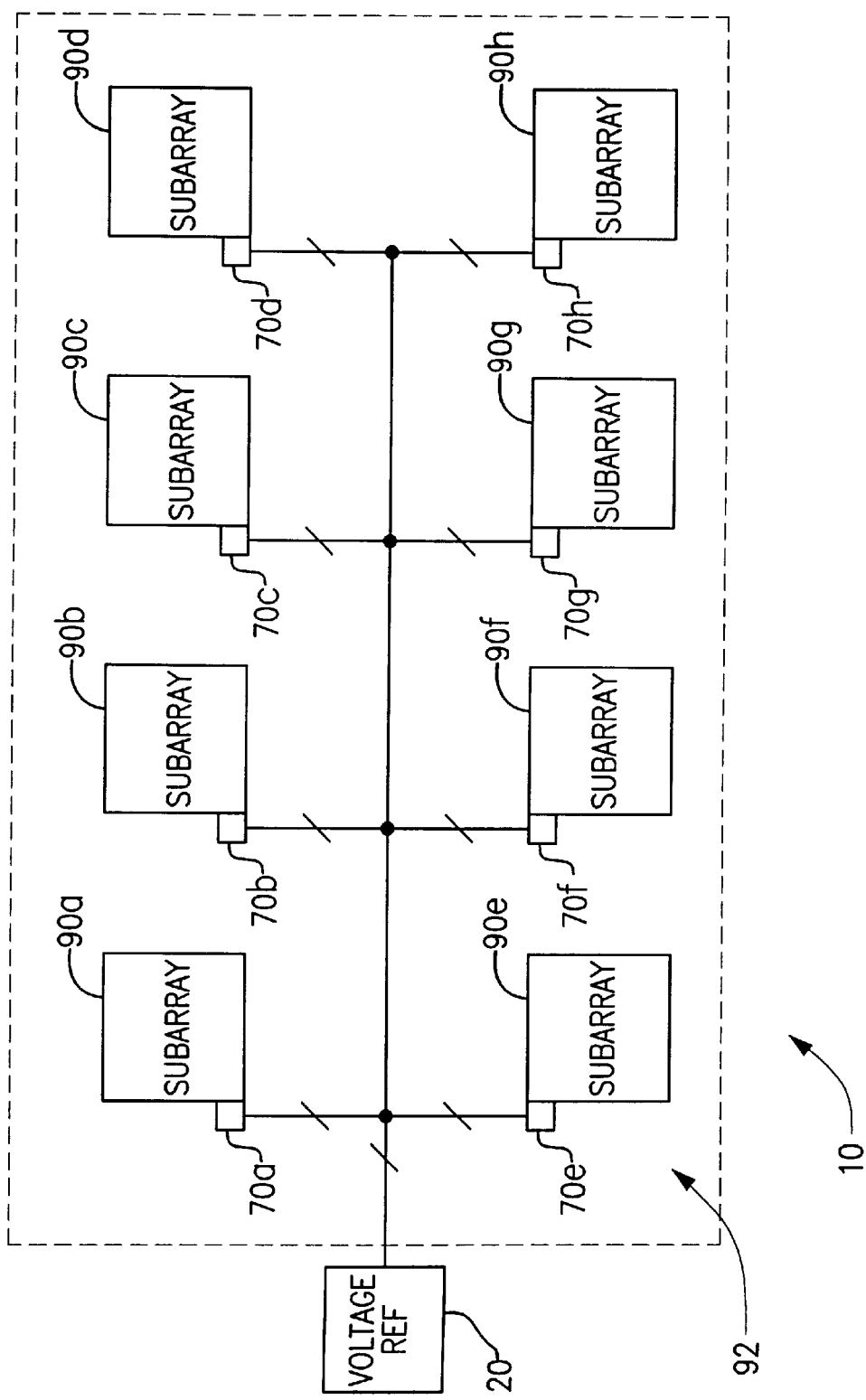
FIG. 2 illustrates a memory incorporating a distributed voltage generator constructed in accordance with an exemplary embodiment of the invention.

FIG. 2 illustrates an exemplary DRAM device 10 incorporating distributed voltage generator circuitry constructed in accordance with an exemplary embodiment of the invention. The DRAM 10 includes a memory array 92. In this example, the array 92 is divided into eight subarrays 90a, 90b, 90c, 90d, 90e, 90f, 9g, 90h (hereinafter collectively referred to as "subarrays 90"). It should be noted that the array 92 does not have to be subdivided to practice the present invention. Moreover, the number of subarrays 90 illustrated is but one example and is not important to practice the present invention.

Coupled to and associated with the subarrays 90 are eight reference voltage drivers 70a, 70b, 70c, 70d, 70e, 70f, 70g, 70h (hereinafter collectively referred to as "drivers 70"). The voltage drivers 70 output the cell plate and equilibrate reference voltage DVC2 and are connected to the cell plates and equilibrate circuits of the corresponding subarrays 90 in a manner illustrated in FIG. 1.

A voltage reference circuit 20 is located in the periphery of the array 92. The voltage reference circuit 20 is coupled to the drivers 70. The voltage reference circuit 20 and the distributed voltage drivers 70 define the voltage generator of this exemplary embodiment of the invention. As will become apparent from the descriptions of FIGS. 3 and 4, the drivers 70 consist of only two transistors. By having a single voltage reference circuit 20 located in the periphery of the array 92 and very small drivers 70 within the array 92, the voltage generator of the present invention substantially reduces the amount of space utilized within the array 92. Only the voltage drivers 70 require space within the array 92. This frees up some valuable die space that can be used for other applications or components of the DRAM 10. Other advantages of the present invention will become apparent from the following description.

Figure 3:
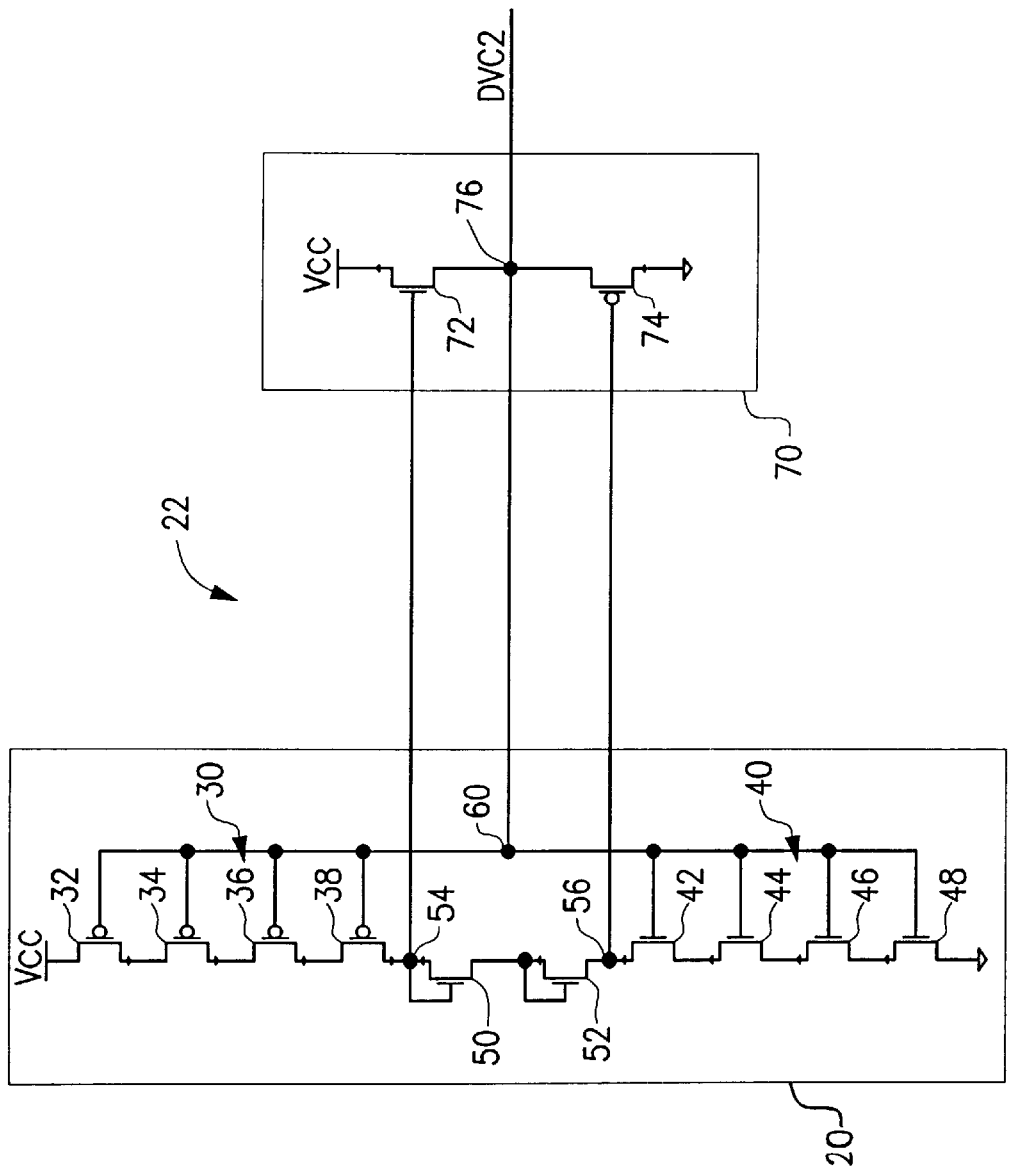
FIG. 3 is a schematic diagram illustrating a first exemplary voltage generator circuit constructed in accordance with an exemplary embodiment of the invention.

FIG. 3 is a schematic diagram illustrating first exemplary voltage generator circuitry 22 constructed in accordance with an exemplary embodiment of the invention. The voltage generator circuitry 22 includes a voltage reference circuit 20 and at least one voltage driver circuit 70. As noted above, if the memory array is divided into subarrays, then the voltage generator circuitry 22 will contain at least one voltage driver circuit 70 for each subarray. The voltage reference circuit 20 contains a first voltage divider 30, second voltage divider 40 and two diodeconnected transistor 50, 52.

The first voltage divider 30 contains four series connected divider transistors 32, 34, 36, 38. It is desired that the four transistors 32, 34, 36, 38 are p-channel MOSFETs 32, 34, 36, 38. The four transistors 32, 34, 36, 38 of the first voltage divider 30 are connected between Vcc and a first node 54. It is desirable that the four transistors 32, 34, 36, 38 of the first voltage divider 30 are long L MOSFET devices to reduce the amount of current flow in the voltage reference circuit 20.

The second voltage divider 40 contains four series connected divider transistors 42,44,46,48. It is desired that the four transistors 42,44, 46, 48 are n-channel MOSFETs 42, 44, 46,48. The four transistors 42,44, 46,48 of the second voltage divider 40 are connected between a ground potential and a second node 56. It is desirable that the four transistors 42, 44, 46, 48 of the second voltage divider 40 are long L MOSFET devices to help reduce the amount of current flow in the voltage reference circuit 20.

The first diode-connected transistor 50 is an n-channel MOSFET with its gate connected to its drain at the first node 54. The second diode-connected transistor 52 is also an n-channel MOSFET with its gate connected to its drain and its source connected at the second node 56. The first and second diode-connected transistors 50, 52 are sized to ensure that the first node 54 is always at a somewhat higher voltage than the second node 56.

The voltage driver 70 contains two driver transistors 72, 74. It is desirable that the first driver transistor 72 be an n-channel MOSFET and the second driver transistor 74 be a p-channel MOSFET. The first driver transistor 72 has its gate connected to the first node 54 of the voltage reference circuit 20 and the second driver transistor 74 has its gate connected to the second node 56 of the voltage reference circuit 20. The drain of the first driver transistor 72 is connected to Vcc and its source is connected to the source of the second driver transistor 74 at a driver node 76. The drain of the second driver transistor 74 is connected to a ground potential and its source is connected to the source of the first driver transistor 72 at the driver node 76. The output at the node is the reference voltage DVC2. In operation, the two voltage dividers 30, 40 and their outputs at the first and second nodes 54, 56 control the generation of the reference voltage DVC2 by the driver circuit 70.

The reference voltage DVC2 that is output at the driver node 76 is fed back to a third node 60 of the voltage reference circuit 20. This feedback from the driver node 76 is used to regulate the reference voltage DVC2 in response to changing current conditions. The feedback of the reference voltage DVC2 is implemented by connecting the gates of the transistors 32, 34, 36, 38 of the first voltage divider 30 and the gates of the transistors 42, 44, 46, 48 of the second voltage divider 40 to the reference voltage DVC2 at the third node 60. With this connection, a decrease in the voltage level of the reference voltage DVC2 decreases the effective resistance of the transistor 32, 34, 36, 38 of the first voltage divider 30 while increasing the effective resistance of the transistor 42, 44, 46, 48 of the second voltage divider 40. This in turn increases the current supplying ability of the voltage reference 20 and driver 70 and raises the level of the reference voltage DVC2. Conversely, an increase in the voltage level of the reference voltage DVC2 increases the effective resistance of the transistor 32, 34, 36, 38 of the first voltage divider 30 while decreasing the effective resistance of the transistor 42, 44, 46, 48 of the second voltage divider 40. This in turn decreases the current supplying ability of the voltage reference 20 and driver 70 and lowers the level of the reference voltage DVC2. Thus, the reference voltage DVC2 is regulated to compensate for changing current demands placed on the voltage generator circuitry 22.

As noted above, the use of a single voltage reference circuit 20 located in the periphery of the array 92 (FIG. 2) and distributed drivers 70 within the array 92 reduces the amount of space used within the array 92 by the voltage generator 22 of the present embodiment. Moreover, by having only small transistors 72, 74 distributed within the drivers 70, bit line coupling caused by cell plate movement is also substantially reduced. In addition, by providing distributed driver circuits 70 at each array/subarray, the amount of voltage swelling and dips experienced throughout the DRAM array should also be substantially reduced. Thus, the voltage generator 22 of the present embodiment exhibits several advantages over the prior art.

Figure 4:
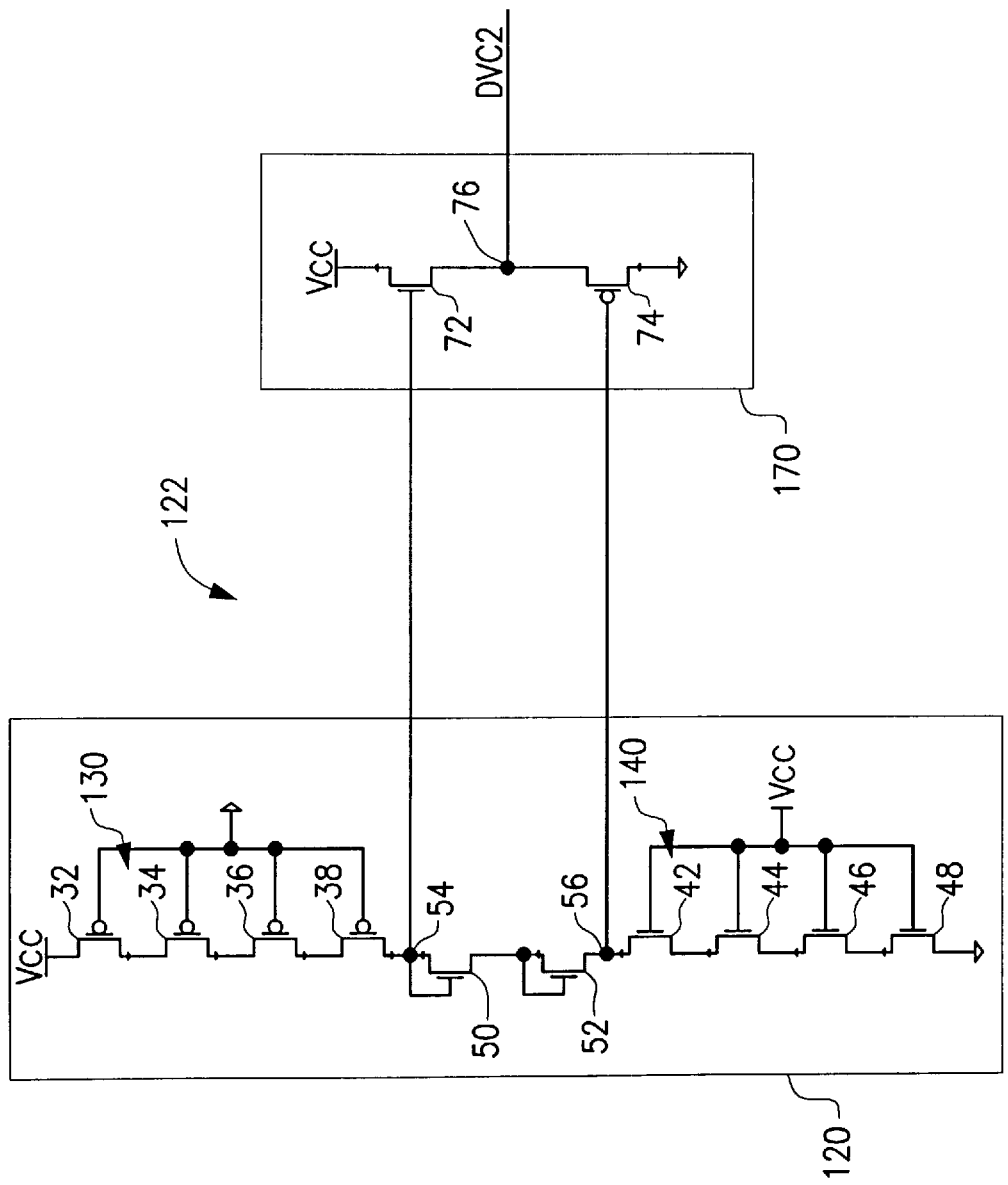
FIG. 4 is a schematic diagram illustrating a second exemplary voltage generator circuit constructed in accordance with another exemplary embodiment of the invention.

FIG. 4 is a schematic diagram illustrating a second exemplary voltage generator circuit 122 constructed in accordance with another exemplary embodiment of the invention. Wherever possible, reference numerals used to describe components and nodes of the voltage generator circuit 22 in FIG. 3 will be used to describe similar components and nodes in the voltage generator circuit 122 in FIG. 4.

The voltage generator circuitry 122 includes a voltage reference circuit 120 and at least one voltage driver circuit 170. As noted above, if the memory array is divided into subarrays, then the voltage generator circuitry 122 will contain at least one voltage driver circuit 170 for each subarray. The voltage reference circuit 120 contains a first voltage divider 130, second voltage divider 140 and two diodeconnected transistor 50, 52.

The first voltage divider 130 contains four series connected divider transistors 32, 34, 36, 38. It is desired that the four transistors 32, 34, 36, 38 are p-channel MOSFETs 32, 34, 36, 38. The four transistors 32, 34, 36, 38 of the first voltage divider 130 are connected between Vcc and a first node 54. It is desirable that the four transistors 32, 34, 36, 38 of the first voltage divider 130 are long L MOSFET devices to reduce the amount of current flow in the voltage reference circuit 120.

The second voltage divider 140 contains four series connected divider transistors 42, 44, 46, 48. It is desired that the four transistors 42, 44, 46, 48 are n-channel MOSFETs 42, 44, 46, 48. The four transistors 42, 44, 46, 48 of the second voltage divider 140 are connected between a ground potential and a second node 56. It is desirable that the four transistors 42, 44, 46, 48 of the second voltage divider 140 are long L MOSFET devices to help reduce the amount of current flow in the voltage reference circuit 120.

The first diode-connected transistor 50 is an n-channel MOSFET with its gate connected to its drain at the first node 54. The second diode-connected transistor 52 is also an n-channel MOSFET with its gate connected to its drain and its source connected at the second node 56. The first and second diode-connected transistors 50, 52 are sized to ensure that the first node 54 is always at a somewhat higher voltage than the second node 56.

The voltage driver 170 contains two driver transistors 72, 74. It is desirable that the first driver transistor 72 be an n-channel MOSFET and the second driver transistor 74 be a p-channel MOSFET. The first driver transistor 72 has its gate connected to the first node 54 of the voltage reference circuit 120 and the second driver transistor 74 has its gate connected to the second node 56 of the voltage reference circuit 120. The drain of the first driver transistor 72 is connected to Vcc and its source is connected to the source of the second driver transistor 74 at a driver node 76. The drain of the second driver transistor 74 is connected to a ground potential and its source is connected to the source of the first driver transistor 72 at the driver node 76. The output at the node is the reference voltage DVC2. In operation, the two voltage dividers 130, 140 and their outputs at the first and second nodes 54, 56 control the generation of the reference voltage DVC2 by the driver circuit 170.

Figure 1:
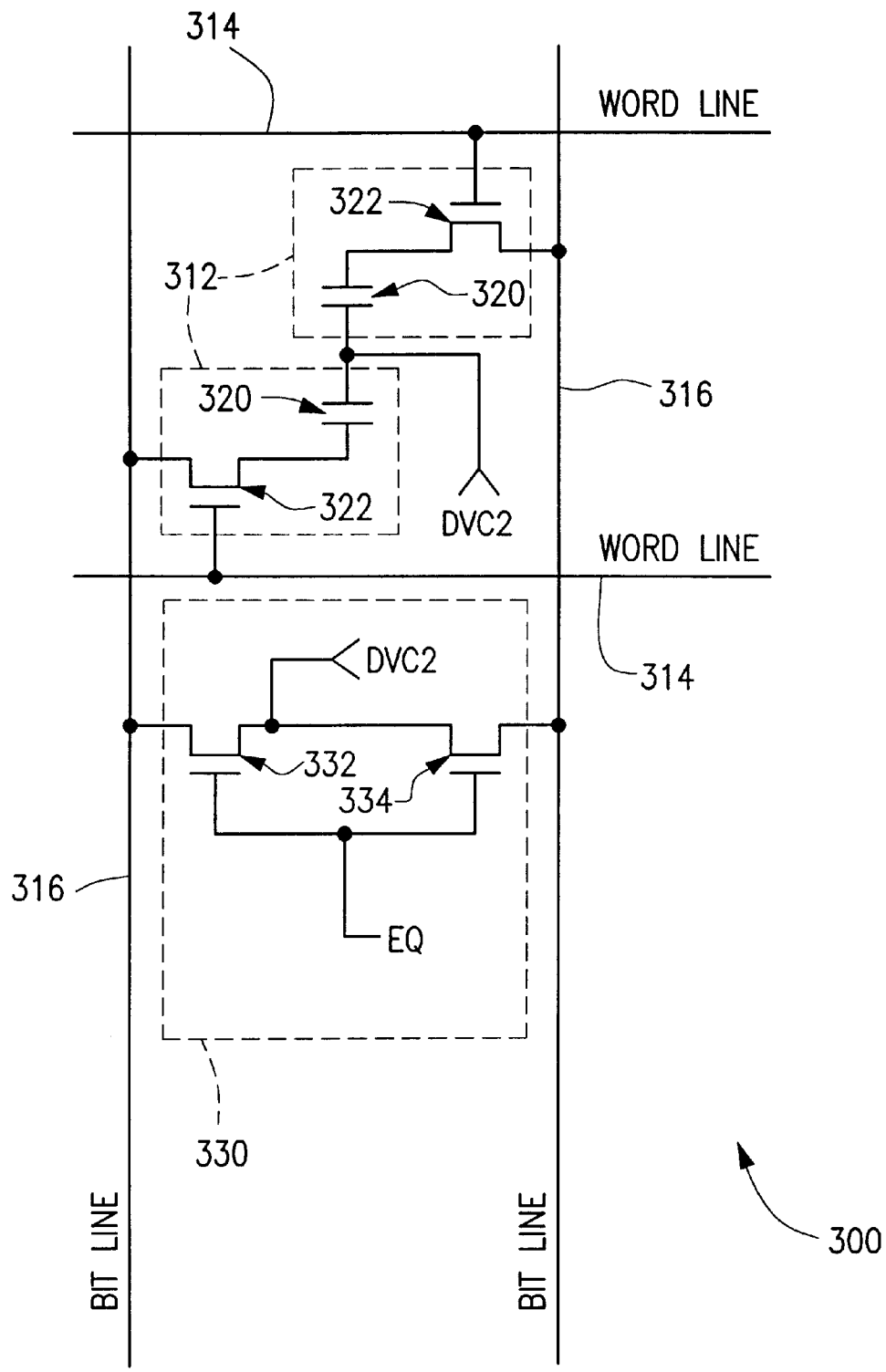
FIG. 1 is a schematic diagram of a portion of a conventional dynamic random access memory device.

Unlike the voltage generator 22 illustrated in FIG. 1, the reference voltage DVC2 that is output from the voltage driver 170 is not fed back into the voltage reference circuit 120. Instead, the gates of the transistors 32, 34, 36, 38 of the first voltage divider 130 are tied together and connected to a ground potential and the gates of the transistors 42, 44, 46, 48 of the second voltage divider 140 are tied together and connected to Vcc. With this configuration, the voltage generator 122 reduces the number of wires used to connect the voltage reference 120 to the voltage driver 170. Thus, the amount of area used within the array by the voltage generator 122 is even further reduced. The tradeoff, however, is that the voltage generator 122 will not have a DVC2 feedback that can be used to compensate for changing current.

As noted above, the use of a single voltage reference circuit 120 located in the periphery of the array 92 (FIG. 2) and distributed drivers 170 within the array 92 reduces the amount of space used within the array 92 by the voltage generator 122 of the present embodiment. Moreover, by having only small transistors 72, 74 distributed within the drivers 170, bit line coupling caused by cell plate movement is also substantially reduced. In addition, by providing distributed driver circuits 170 at each array/subarray, the amount of voltage swelling and dips experienced throughout the DRAM array should also be substantially reduced. Thus, the voltage generator 122 of the present embodiment exhibits several advantages over the prior art.

Figure 5:
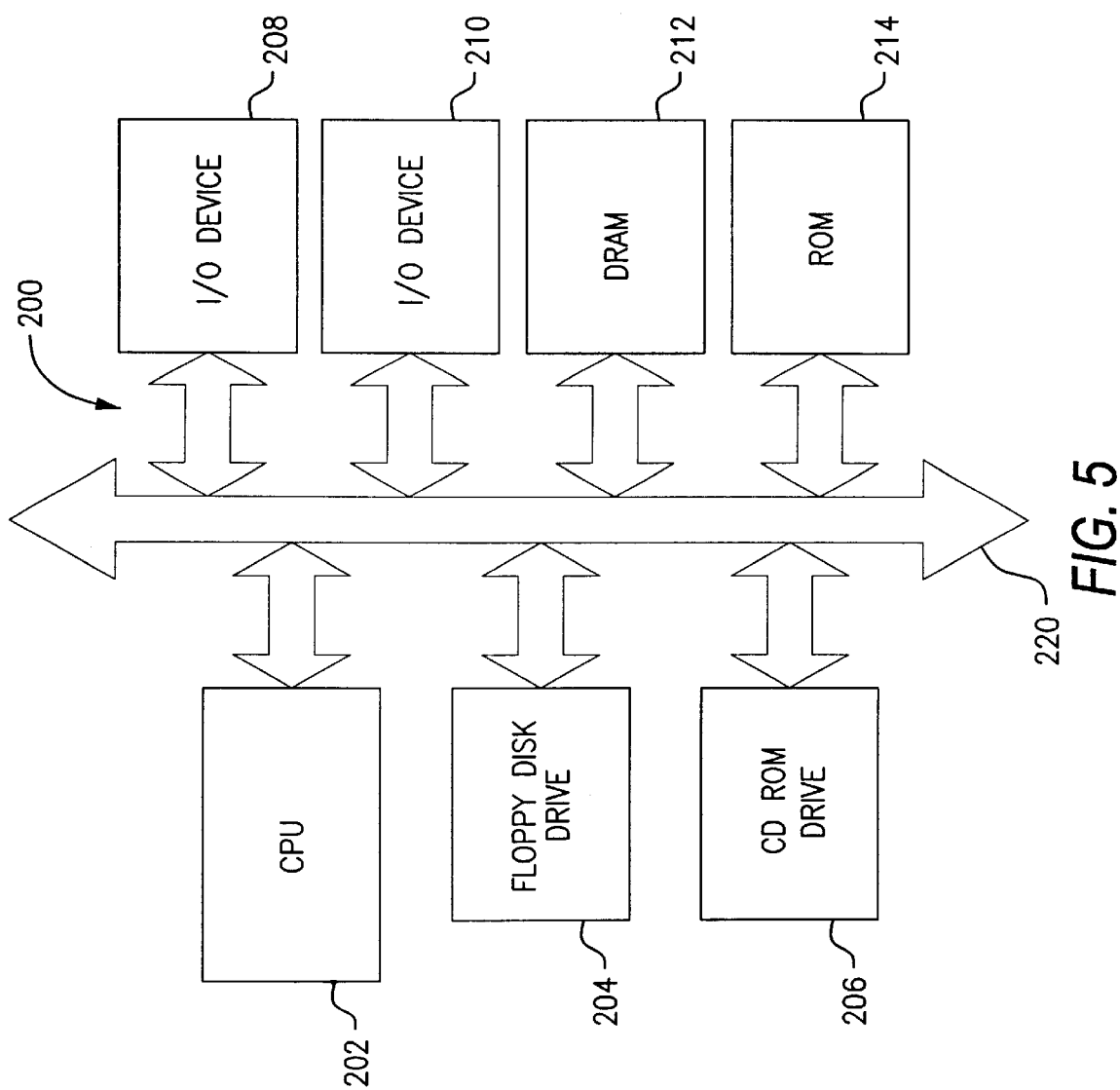
FIG. 5 is a block diagram of a processor-based system utilizing a memory circuit constructed in accordance with an exemplary embodiment of the present invention.

FIG. 5 is a block diagram of a processor-based system 200 utilizing a DRAM 212 constructed in accordance with one of the embodiments of the present invention. That is, the DRAM 212 utilizes the distributed voltage generators 22, 122 illustrated in FIGS. 3 and 4. The processor-based system 200 may be a computer system, a process control system or any other system employing a processor and associated memory. The system 200 includes a central processing unit (CPU) 202, e.g., a microprocessor, that communicates with the DRAM 212 and an I/O device 208 over a bus 220. It must be noted that the bus 220 may be a series of buses and bridges commonly used in a processor-based system, but for convenience purposes only, the bus 220 has been illustrated as a single bus. A second I/O device 210 is illustrated, but is not necessary to practice the invention. The processor-based system 200 also includes read-only memory (ROM) 214 and may include peripheral devices such as a floppy disk drive 204 and a compact disk (CD) ROM drive 206 that also communicates with the CPU 202 over the bus 220 as is well known in the art.

It should be appreciated that the distributed voltage generator circuits of the present invention can be used to supply the reference voltage DVC2 to individual arrays of the memory device, as well as the individual subarrays of each array, using a single voltage reference circuit. That is, a single voltage reference circuit can be located in the periphery of multiple arrays with connections to the distributed drivers associated with the arrays (and subarrays).

While the invention has been described in detail in connection with the exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A voltage generator for a memory device having at least one memory array, said voltage generator comprising:
    at least one voltage driver connected to and associated with each memory array, each voltage driver generating and outputting a reference voltage to circuitry within its corresponding memory array; and
    a voltage reference circuit coupled to each voltage driver, said voltage reference circuit having outputs for controlling each voltage driver to generate the reference voltage, said voltage reference circuit being located in a periphery of the memory array.

2. The generator of claim 1 wherein the reference voltage output from each voltage reference circuit is connected to a plurality of cell plates of memory cells contained within its associated memory array.

3. The generator of claim 1 wherein the reference voltage output from each voltage reference circuit is connected to a plurality of equilibration circuits contained within its associated memory array.

4. The generator of claim 1 wherein the reference voltage of each voltage driver is connected to an output of said voltage reference circuit.

5. The generator of claim 1 wherein said voltage reference circuit comprises:
    a first voltage divider connected between a first supply voltage and a first node, said first voltage divider generating a first voltage output at said first node; and
    a second voltage divider connected between a second supply voltage and a second node, said second voltage divider generating a second voltage output at said second node, wherein said first and second voltage outputs are used by said voltage reference circuit to control said at least one voltage driver.

6. The generator of claim 5, further comprising:
    a pair of voltage drop elements connected between said first and second nodes, said voltage drop elements ensuring that said first node has a higher voltage level than said second node.

7. The generator of claim 6, wherein said first voltage divider comprises a plurality of series connected voltage divider elements connected between said first supply voltage and said first node.

8. The generator of claim 6, wherein said first voltage divider comprises a plurality of series connected transistors connected between said first supply voltage and said first node.

9. The generator of claim 6, wherein said second voltage divider comprises a plurality of series connected voltage divider elements connected between said second supply voltage and said second node.

10. The generator of claim 6, wherein said second voltage divider comprises a plurality of series connected transistors connected between said second supply voltage and said second node.

11. The generator of claim 1, wherein each memory array is divided into a plurality of subarrays and said generator comprises at least one driver connected to and associated with each subarray.

12. A cell plate and equilibrate voltage generator for a memory device having a plurality of memory arrays, said generator comprising:
    at least one voltage driver connected to and associated with each memory array, each voltage driver generating and outputting a reference voltage to cell plate and equilibrate circuitry within its corresponding memory array; and
    a voltage reference circuit coupled to each voltage driver, said voltage reference circuit having outputs for controlling each voltage driver to generate the reference voltage, said voltage reference circuit being located in a different region of the memory device then said at least one voltage driver.

13. The generator of claim 12 further comprising feedback circuitry connected between the reference voltage of each voltage driver and an input of said voltage reference circuit.

14. The generator of claim 12 wherein said voltage reference circuit comprises:
    a first voltage divider connected between a first supply voltage and a first node, said first voltage divider generating a first voltage output at said first node; and
    a second voltage divider connected between a second supply voltage and a second node, said second voltage divider generating a second voltage output at said second node, wherein said first and second voltage outputs are used by said voltage reference circuit to control said at least one driver.

15. The generator of claim 14, further comprising:
    a pair of voltage drop elements connected between said first and second nodes, said voltage drop elements ensuring that said first node has a higher voltage level than said second node.

16. The generator of claim 15, wherein said first voltage divider comprises a plurality of series connected voltage divider elements connected between said first supply voltage and said first node.

17. The generator of claim 15, wherein said first voltage divider comprises a plurality of series connected transistors connected between said first supply voltage and said first node.

18. The generator of claim 15, wherein said second voltage divider comprises a plurality of series connected voltage divider elements connected between said second supply voltage and said second node.

19. The generator of claim 15, wherein said second voltage divider comprises a plurality of series connected transistors connected between said second supply voltage and said second node.

20. A memory device comprising:
    at least one memory array; and
    a voltage generator comprising:
        at least one voltage driver connected to and associated with each memory array, each voltage driver generating and outputting a reference voltage to circuitry within its corresponding memory array; and a voltage reference circuit coupled to each voltage driver, said voltage reference circuit having outputs for controlling each voltage driver to generate the reference voltage, said voltage reference circuit being located in a periphery of the memory array.

21. The device of claim 20 wherein the reference voltage output from each voltage reference circuit is connected to a plurality of cell plates of memory cells contained within its associated memory array.

22. The device of claim 20 wherein the reference voltage output from each voltage reference circuit is connected to a plurality of equilibration circuits contained within its associated memory array.

23. The device of claim 20 wherein the reference voltage of each voltage driver is connected to an output of said voltage reference circuit.

24. The device of claim 20 wherein said voltage reference circuit comprises:
    a first voltage divider connected between a first supply voltage and a first node, said first voltage divider generating a first voltage output at said first node; and
    a second voltage divider connected between a second supply voltage and a second node, said second voltage divider generating a second voltage output at said second node, wherein said first and second voltage outputs are used by said voltage reference circuit to control said at least one driver.

25. The device of claim 24, further comprising:
    a pair of voltage drop elements connected between said first and second nodes, said voltage drop elements ensuring that said first node has a higher voltage level than said second node.

26. The device of claim 24, wherein said first voltage divider comprises a plurality of series connected voltage divider elements connected between said first supply voltage and said first node.

27. The device of claim 24, wherein said first voltage divider comprises a plurality of series connected transistors connected between said first supply voltage and said first node.

28. The device of claim 24, wherein said second voltage divider comprises a plurality of series connected voltage divider elements connected between said second supply voltage and said second node.

29. The device of claim 24, wherein said second voltage divider comprises a plurality of series connected transistors connected between said second supply voltage and said second node.

30. The device of claim 20, wherein each memory array is divided into a plurality of subarrays and said voltage generator comprises at least one driver connected to and associated with each subarray.

31. A memory device comprising:
    at least one memory array;
    at least one voltage driver connected to and associated with each memory array, each voltage driver generating and outputting a reference voltage to cell plate and equilibrate circuitry within its corresponding memory array; and
    a voltage reference circuit coupled to each voltage driver, said voltage reference circuit having outputs for controlling each voltage driver to generate the reference voltage, said voltage reference circuit being located in a different region of the memory device then said at least one voltage driver.

32. The device of claim 31 further comprising feedback circuitry connected between the reference voltage of each voltage driver and an input of said voltage reference circuit.

33. The device of claim 31 wherein said voltage reference circuit comprises:
    a first voltage divider connected between a first supply voltage and a first node, said first voltage divider generating a first voltage output at said first node; and
    a second voltage divider connected between a second supply voltage and a second node, said second voltage divider generating a second voltage output at said second node, wherein said first and second voltage outputs are used by said voltage reference circuit to control said at least one driver.

34. The device of claim 33, further comprising:
    a pair of voltage drop elements connected between said first and second nodes, said voltage drop elements ensuring that said first node has a higher voltage level than said second node.

35. The device of claim 33, wherein said first voltage divider comprises a plurality of series connected voltage divider elements connected between said first supply voltage and said first node.

36. The device of claim 33, wherein said first voltage divider comprises a plurality of series connected transistors connected between said first supply voltage and said first node.

37. The device of claim 33, wherein said second voltage divider comprises a plurality of series connected voltage divider elements connected between said second supply voltage and said second node.

38. The device of claim 33, wherein said second voltage divider comprises a plurality of series connected transistors connected between said second supply voltage and said second node.

39. A processor-based system, comprising:
    a processor; and
    a memory device coupled to said processor, said memory device having at least one memory array and a voltage generator circuit, said voltage generator circuit comprising:
        at least one voltage driver connected to and associated with each memory array, each voltage driver generating and outputting a reference voltage to circuitry within its corresponding memory array; and
        a voltage reference circuit coupled to each voltage driver, said voltage reference circuit having outputs for controlling each voltage driver to generate the reference voltage, said voltage reference circuit being located in a periphery of the memory array.

40. The system of claim 39 wherein the reference voltage of each voltage driver is connected to an output of said voltage reference circuit.

41. The system of claim 39 wherein said voltage reference circuit comprises:
    a first voltage divider connected between a first supply voltage and a first node, said first voltage divider generating a first voltage output at said first node; and
    a second voltage divider connected between a second supply voltage and a second node, said second voltage divider generating a second voltage output at said second node, wherein said first and second voltage outputs are used by said voltage reference circuit to control said at least one driver.

42. The system of claim 41, further comprising:
    a pair of voltage drop elements connected between said first and second nodes, said voltage drop elements ensuring that said first node has a higher voltage level than said second node.

43. The system of claim 39, wherein each memory array is divided into a plurality of subarrays and said generator circuit comprises at least one driver connected to and associated with each subarray.

44. A processor-based system, comprising:
a processor; and
a memory device coupled to said processor, said memory device having a plurality of memory arrays, at least one voltage driver connected to and associated with each memory array, each voltage driver generating and outputting a reference voltage to cell plate and equilibrate circuitry within its corresponding memory array, said memory device further comprising a voltage reference circuit coupled to each voltage driver, said voltage reference circuit having outputs for controlling each voltage driver to generate the reference voltage, said voltage reference circuit being located in a different region of the memory device then the at least one voltage driver.

45. The system of claim 44 further comprising feedback circuitry connected between the reference voltage of each voltage driver and an input of said voltage reference circuit.

46. The system of claim 44 wherein said voltage reference circuit comprises:
a first voltage divider connected between a first supply voltage and a first node, said first voltage divider generating a first voltage output at said first node; and
a second voltage divider connected between a second supply voltage and a second node, said second voltage divider generating a second voltage output at said second node, wherein said first and second voltage outputs are used by said voltage reference circuit to control said at least one driver.

47. The system of claim 46, further comprising:
a pair of voltage drop elements connected between said first and second nodes, said voltage drop elements ensuring that said first node has a higher voltage level than said second node.

48. The system of claim 47, wherein said first voltage divider comprises a plurality of series connected voltage divider elements connected between said first supply voltage and said first node.

49. The system of claim 47, wherein said first voltage divider comprises a plurality of series connected transistors connected between said first supply voltage and said first node.

50. The system of claim 47, wherein said second voltage divider comprises a plurality of series connected voltage divider elements connected between said second supply voltage and said second node.

51. The system of claim 47, wherein said second voltage divider comprises a plurality of series connected transistors connected between said second supply voltage and said second node.

52. A method of operating a voltage generator to provide a reference voltage to at least one memory array, said method comprising:
associating a driver circuit to each memory array;
generating control signals from a periphery of the at least one array, the control signals for respectively controlling each voltage driver;
outputting the control signals to each voltage driver;
generating at each voltage driver the reference voltage based on the respective control signals; and
outputting the reference voltage to circuitry within each array associated with each voltage driver.

53. The method of claim 52 further comprising the step of inputting the reference voltage into a circuit responsible for generating the control signals.

54. The method of claim 53 further comprising the step of adjusting a level of the reference voltage based on a level of the reference voltage input into the circuit responsible for generating the control signals.

55. The method of claim 52 wherein the reference voltage is applied to cell plates of memory cells within each memory array.

56. The method of claim 52 wherein the reference voltage is applied to equilibrate circuits within each memory array.

57. A voltage generator for a memory device having at least one memory array, said voltage generator comprising:
at least one voltage driver connected to and associated with each memory array, each voltage driver generating and outputting a reference voltage to circuitry within its corresponding memory array; and
a voltage reference circuit coupled to each voltage driver, said voltage reference circuit having outputs for controlling each voltage driver to generate the reference voltage, said voltage reference circuit being located in a periphery of the memory array and located in a different region of the memory device then said voltage driver.

58. The generator of claim 57 wherein the reference voltage of each voltage driver is connected to an output of said voltage reference circuit.

59. The generator of claim 57 wherein said voltage reference circuit comprises:
a first voltage divider connected between a first supply voltage and a first node, said first voltage divider generating a first voltage output at said first node; and
a second voltage divider connected between a second supply voltage and a second node, said second voltage divider generating a second voltage output at said second node, wherein said first and second voltage outputs are used by said voltage reference circuit to control said at least one voltage driver.

60. The generator of claim 57, wherein each memory array is divided into a plurality of subarrays and said generator comprises at least one driver connected to and associated with each subarray.

61. A cell plate and equilibrate voltage generator for a memory device having a plurality of memory arrays, said generator comprising:
a plurality of voltage drivers, each voltage driver connected to and associated with a respective memory array, each voltage driver generating and outputting a reference voltage to cell plate and equilibrate circuitry within its corresponding memory array; and
a voltage reference circuit coupled to each voltage driver, said voltage reference circuit having outputs for controlling each voltage driver to generate the reference voltage, said voltage reference circuit being located in a different region of the memory device then said voltage driver.

62. The generator of claim 61 further comprising feedback circuitry connected between the reference voltage of each voltage driver and an input of said voltage reference circuit.

63. The generator of claim 61 wherein said voltage reference circuit comprises:
a first voltage divider connected between a first supply voltage and a first node, said first voltage divider generating a first voltage output at said first node; and a second voltage divider connected between a second supply voltage and a second node, said second voltage divider generating a second voltage output at said second node, wherein said first and second voltage outputs are used by said voltage reference circuit to control said at least one driver.

64. The generator of claim 63, further comprising:

a pair of voltage drop elements connected between said first and second nodes, said voltage drop elements ensuring that said first node has a higher voltage level than said second node.

65. The generator of claim 64, wherein said first voltage divider comprises a plurality of series connected voltage divider elements connected between said first supply voltage and said first node.

66. The generator of claim 64, wherein said first voltage divider comprises a plurality of series connected transistors connected between said first supply voltage and said first node.

67. The generator of claim 64, wherein said second voltage divider comprises a plurality of series connected voltage divider elements connected between said second supply voltage and said second node.

68. The generator of claim 64, wherein said second voltage divider comprises a plurality of series connected transistors connected between said second supply voltage and said second node.

* * * * *